United States Patent
Chiba

(10) Patent No.: US 7,294,998 B2
(45) Date of Patent: Nov. 13, 2007

(54) TIMING GENERATION CIRCUIT AND SEMICONDUCTOR TEST DEVICE HAVING THE TIMING GENERATION CIRCUIT

(75) Inventor: Noriaki Chiba, Tokyo (JP)

(73) Assignee: Advantest Corp., Tokyo (JP)

( * ) Notice: Subject to any disclaimer, the term of this patent is extended or adjusted under 35 U.S.C. 154(b) by 190 days.

(21) Appl. No.: 10/538,595

(22) PCT Filed: Dec. 12, 2003

(86) PCT No.: PCT/JP03/15920

§ 371 (c)(1), (2), (4) Date: Jun. 9, 2005

(87) PCT Pub. No.: WO2004/055532

PCT Pub. Date: Jul. 1, 2004

(65) Prior Publication Data

US 2006/0056269 A1    Mar. 16, 2006

(30) Foreign Application Priority Data

Dec. 13, 2002    (JP)    ............... 2002-362392

(51) Int. Cl.
*G01R 31/28* (2006.01)
(52) U.S. Cl. .................... 324/158.1; 714/720
(58) Field of Classification Search ................ 714/720
See application file for complete search history.

(56) References Cited

U.S. PATENT DOCUMENTS

| | | | | |
|---|---|---|---|---|
| 4,998,025 A | * | 3/1991 | Watanabe | 327/141 |
| 5,293,080 A | * | 3/1994 | Hiwada et al. | 327/141 |
| 5,406,132 A | * | 4/1995 | Housako | 327/172 |
| 5,854,798 A | * | 12/1998 | Uehara | 714/738 |
| 6,226,230 B1 | * | 5/2001 | Watanabe | 368/113 |
| 6,903,566 B2 | * | 6/2005 | Sudou et al. | 324/765 |
| 7,164,617 B2 | * | 1/2007 | Honda | 365/233 |

FOREIGN PATENT DOCUMENTS

| | | |
|---|---|---|
| JP | 7-26787 | 5/1995 |
| JP | 10-319097 | 12/1998 |
| JP | 2000-305800 | 11/2000 |
| JP | 2001-124835 | 5/2001 |

* cited by examiner

*Primary Examiner*—Ha Tran Nguyen
*Assistant Examiner*—Richard Isla-Rodas
(74) *Attorney, Agent, or Firm*—Muramatsu & Associates

(57) ABSTRACT

A timing generation circuit can increase a maximum delay amount without changing the configuration of a timing memory. The timing generation circuit includes: a timing memory (TMM) 10 containing predetermined timing data; a plurality of down counters 20 for loading the timing data from the TMM and outputting a pulse signal at the timing indicated by the timing data; an address selection circuit 40 for specifying one or two TMM addresses by switching and outputting corresponding one or plural timing data; a load data switching circuit 50 for loading the plural timing data to the plural down counters cascaded and outputting one timing pulse signal; and a timing data selection circuit 60 for selecting one of the pulse signals. The plural timing data are generated by dividing the timing memory into a plurality of memory regions either in a column or row direction.

8 Claims, 12 Drawing Sheets

| | TMM | | | | DOWN COUNTER | | |
|---|---|---|---|---|---|---|---|
| | TOTAL LATCH NUMBER | SET DATA BIT WIDTH | MEMORY DEPTH (TS NUMBER) | PHASE NUMBER | BIT NUMBER /PHASE | MAXIMUM TIMING DELAY | |
| STANDARD DELAY TG (mode=0) | n×m | m | n | 4 | m | SysCLK$(2^m-1)$, m-1···m | |
| LONG DELAY TG (mode=1) | n/2×2m | 2m | n/2 | 2 | 2m | SysCLK$(2^M-1)$, $1 \leq M \leq 2m$ | |

(a)

SWITCH BY MODE SIGNAL (b)

TIMING GENERATION CIRCUIT AND SEMICONDUCTOR TEST DEVICE HAVING THE TIMING GENERATION CIRCUIT

TECHNICAL FIELD

The present invention relates to a timing generation circuit (timing generator: TG) which generates a timing of a signal waveform applied to a device under test in a semiconductor test device, particularly to a timing generation circuit capable of increasing a maximum delay amount of a timing edge or capable of increasing the number of timing sets (TS) without changing a configuration of a timing memory containing predetermined timing data and suitable for a semiconductor test device in which a plurality of types of TGs are realized by one type of hardware configuration and low-cost device measurement is possible.

BACKGROUND ART

In general, in a semiconductor test device, a test pattern signal is input into a semiconductor device (device under test: DUT) which is a test object, a response signal output from the DUT is compared with an expected pattern signal to judge agreement/disagreement, and accordingly the DUT is tested. Moreover, the semiconductor test device usually includes a timing generation circuit (TG) which generates a timing of a waveform in order to apply a test signal to the DUT at a predetermined timing.

FIG. 10 is a block diagram showing a basic configuration of a general semiconductor memory test device.

As shown in FIG. 10, the memory test device includes: a timing generation circuit (timing generator: TG) 1; a pattern generation unit 2; a waveform formatter 3; a logical comparison unit 4; and a failure analysis memory unit 5, thereby constituting a memory test device for testing a memory M.

The timing generation circuit 1 generates a reference clock in a semiconductor memory test device.

The pattern generation unit 2 generates an address signal to be applied to the memory M to be tested which is a test object, test pattern data, control signal, and expected value data to be applied to the logical comparison unit 4 in accordance with the reference clock generated by the timing generation circuit 1.

The address signal, test pattern data, and control signal output from the pattern generation unit 2 are input into the waveform formatter 3 to format waveforms, and applied to the memory M to be tested.

In the memory M to be tested, a write or read operation of a data signal is performed based on the supplied control signal, data is read out of the applied address, and the applied write data is written into the address. The data read out of the memory M to be tested is output as a response signal, and supplied to the logical comparison unit 4.

On inputting the response signal from the memory M to be tested, and the expected value data generated by the pattern generation unit 2, the logical comparison unit 4 compares both the data to detect the agreement/disagreement. Accordingly, it is judged whether or not the memory M under test is satisfactory.

Fail data is inputted into the failure analysis memory unit 5 in a case where the response signal from the memory M to be tested disagrees with the expected value data. The fail data is stored in a memory cell corresponding to the address signal output from the pattern generation unit. The fail data stored in the failure analysis memory unit 5 is separately read out and used in analyzing the failure of the memory M.

FIG. 11 is a block diagram showing details of a conventional timing generation circuit incorporated in the semiconductor test device described above.

As shown in the figure, a conventional timing generation circuit (timing edge generation unit) comprises: a timing memory (TMM) 110 in which predetermined timing data (e.g., delay data of a reference clock) is stored; a down counter 120 for outputting a pulse signal at a predetermined timing indicated by the timing data; and a counter load enable selection circuit 130 which inputs a load signal into the down counter 120.

In this conventional timing generation circuit, the timing data stored in the timing memory 110 is set in the down counter 120, and the set timing data is loaded by the load signal of the counter load enable selection circuit 130 to thereby decrement the timing data by one in synchronization with each occurance of a CLK signal in the down counter 120.

Moreover, when the counted-down timing data indicates "0", a pulse signal ("ALL zero" signal) is output from the down counter 120. This pulse signal is input as a timing signal into the pattern generation unit or the like (not shown).

Specifically, to operate the timing generation circuit actually in the semiconductor test device, any one of column-direction addresses (Adr: 0 to Adr: n−1 shown in FIG. 11) of the TMM 110 is designated, accordingly the data of a row-direction bit width (m bits b0 to bm−1 in an example shown in FIG. 11) stored in the address is set in the a down counter 20, and timing data can be loaded by the load signal of the counter load enable selection circuit 130 to count down. Thus, in the conventional timing generation circuit, when the timing data indicating a desired timing is stored in the TMM, for example, a timing signal can be generated which is indicated by a delay time which is an arbitrary integer multiple of a CLK signal period.

It is to be noted that the timing generation circuit is usually provided with a plurality of down counters, and, for example, as shown in FIG. 12, four-phase down counters 120a to 120d are disposed. Accordingly, while counting down the timing signal disposed in one down counter, the next timing signal is loaded on another down counter so that the down-count can be performed.

As described above, in the conventional timing generation circuit provided with the TMM in which the predetermined timing data is stored, the timing data having the row-direction bit width of the memory (TMM) can be set as many as timings set for the column-direction addresses of the memory.

However, in the conventional timing generation circuit in which a delay amount (e.g., 16 μs or less with a 20-bit width, etc.) is determined by the bit width (row direction) of the TMM in this manner, in order to handle a longer delay amount, it is necessary that a memory configuration of the TMM is changed, and the row-direction bit width is added. Moreover, it has been necessary to add a bit number per phase of the next-stage down counter. Therefore, to increase the delay amount, a circuit scale of the timing edge generation unit enormously increases, and a problem has occurred that the cost of a gate array for establishing the timing generation circuit significantly increases.

Similarly, a timing set (TS) number set to the TMM is also fixed to a column-direction address number, and there is also a problem that the timing set number cannot be increased unless the memory configuration is changed.

The present invention has been proposed to solve the above-noted problems involved in the conventional art, and an object is to provide a timing generation circuit which is capable of increasing a maximum delay amount as well as increasing a timing set number without changing a configuration of a timing memory containing timing data and which realizes a several types of TGs by one type of hardware configuration and enables low-cost device measurement. Another object of the present invention is to provide a semiconductor test device incorporating this timing generation circuit.

DISCLOSURE OF THE INVENTION

To achieve the above object, according to the present invention, there is provided a timing generation circuit including: a timing memory containing predetermined timing data; a counter for loading timing data output from the timing memory and outputting a pulse signal at a timing indicated by the timing data; and load data switching means for dividing a memory region of the timing memory, selecting one or a plurality of timing data output from the divided memory regions, and loading the selected one or plurality of timing data in the counter to thereby output the pulse signal of one timing indicated by the one or plurality of timing data.

According to the timing generation circuit of the present invention constituted in this manner, the load data switching means is configured to divide the memory region of the timing memory in which the predetermined timing data is stored in an address direction (memory column direction) or a data bit width direction (memory row direction). Moreover, when the divided timing data is selected and loaded in the counter, it is possible to output the pulse signal of one timing indicated by one or a plurality of divided timing data.

Consequently, a timing generation circuit can be easily obtained with low cost which is capable of increasing a maximum delay amount and also increasing a timing set number without changing a circuit configuration of the timing memory and which is provided with a function optimum for each IC tester (semiconductor test device), thereby realizing a timing generation circuit with high versatility and expandability.

Moreover, in the timing generation circuit of the present invention, the load data switching means divides the memory region of the timing memory in an address direction by mode switching, links a plurality of timing data output from the divided memory regions in a data bit width direction, and loads these data as one timing data in the counter.

Specifically, the load data switching means includes: an address selection circuit which designates one or a plurality of addresses of the timing memory by the mode switching and which outputs one or a plurality of timing data stored in the corresponding one or plurality of addresses; and a load data switching circuit which loads the one timing data as is in one counter, when one timing data is output from the timing memory by switching, and which loads the plurality of timing data in a plurality of cascaded counters, when a plurality of timing data are output from the timing memory by switching, to thereby output the pulse signal of one timing indicated by the one or plurality of timing data.

Furthermore, the address selection circuit divides one designated address by switching to thereby designate N (N is a natural number) addresses, and outputs N timing data from the timing memory, and the load switching circuit loads the N timing data in N cascaded counters by switching to thereby output the pulse signal of one timing indicated by the N timing data.

According to the timing generation circuit of the present invention constituted in this manner, the memory region of the timing memory can be divided in the address direction, and one address can be designated to output a plurality of timing data. Moreover, when the plurality of timing data are cascaded and loaded in the counter, for example, the pulse signal can be output at the timing indicated by the timing data expressed by the bit width two times larger than the standard bit width.

Consequently, the maximum delay amount can be increased without changing the circuit configuration of the timing memory, and it is possible to obtain the maximum delay amount optimum for each IC tester easily at a low cost.

On the other hand, in the timing generation circuit of the present invention, the load data switching means is configured to switch, accordingly divide the memory region of the timing memory in a data bit width direction, select one timing data from the respective timing data output from the divided memory regions, and load the data in the counter.

Specifically, the load data switching means includes: a data division circuit which divides the timing data stored in one address of the designated timing memory into a plurality of timing data and which outputs the plurality of divided timing data by the mode switching or which outputs one timing data among the plurality of divided timing data; and a load data switching circuit which loads the plurality of timing data in a plurality of cascaded counters, when the plurality of divided timing data are output from the timing memory by the mode switching, and which loads the one timing data as is in one counter, when one divided timing data is output from the timing memory by switching, to thereby output a pulse signal of one timing indicated by the plurality of or one divided timing data.

Moreover, especially the data division circuit is configured to divide one timing data stored in one designated address into N data, input the data, and further designate and output some or all of the N divided timing data, and the load switching circuit is configured to load the N divided timing data in the corresponding N counters, and thereby output a pulse signal of the timing indicated by N timing data per address.

According to the timing generation circuit of the present invention constituted in this manner, the memory region of the timing memory can be divided in the bit width direction of the data, and a plurality of timing data can be output from one timing data. Moreover, when one timing data is selected from the plurality of timing data, for example, it is possible to output the timing data of the data set number having a double address depth.

Consequently, a timing generation circuit can be easily obtained at a low cost, where the timing generation circuit is capable of increasing a timing set number without changing the circuit configuration of the timing memory, thereby establishing any desired number of timing sets optimum for each IC tester.

Moreover, according to the present invention, there is provided a semiconductor test device including a timing generation circuit, which inputs a predetermined test pattern signal into a device under test constituting a test object and which compares a response output signal output from this device under test with a predetermined expected pattern signal to thereby judge whether or not the device under test is satisfactory, and a timing generation circuit which outputs a reference clock signal of the test pattern signal as a delay clock signal delayed by a predetermined time, where the timing generation circuit is configured by any of the above-described timing generation circuits of the present invention.

According to the semiconductor test device comprising the timing generation circuit of the present invention constituted in this manner, as to the timing data stored in the timing memory, the memory region of the timing memory in which predetermined timing data is stored is divided in an address direction (memory column direction) or data bit width direction (memory row direction) by the timing generation circuit according to the present invention. Moreover, the divided timing data are combined, and acquired as the timing data indicating a predetermined delay amount or timing set number, and a pulse signal indicating a desired timing is output.

Consequently, a semiconductor test device can be realized which is capable of increasing the maximum delay amount or increasing the timing set number without changing the circuit configuration of the timing memory and which is capable of easily obtaining the timing data optimum for each IC constituting the test object at the low cost and which is superior in versatility and expandability.

BRIEF DESCRIPTION OF THE DRAWINGS

FIG. 4 is a table showing details of timing data obtained by mode switching in the timing generation circuit according to the first embodiment of the present invention;

BEST MODE FOR CARRYING OUT THE INVENTION

Preferable embodiments of a timing generation circuit according to the present invention will be described hereinafter with reference to the drawings.

First Embodiment

First, a first embodiment of a timing generation circuit of the present invention will be described with reference to FIGS. 1 to 4.

Figure 1:
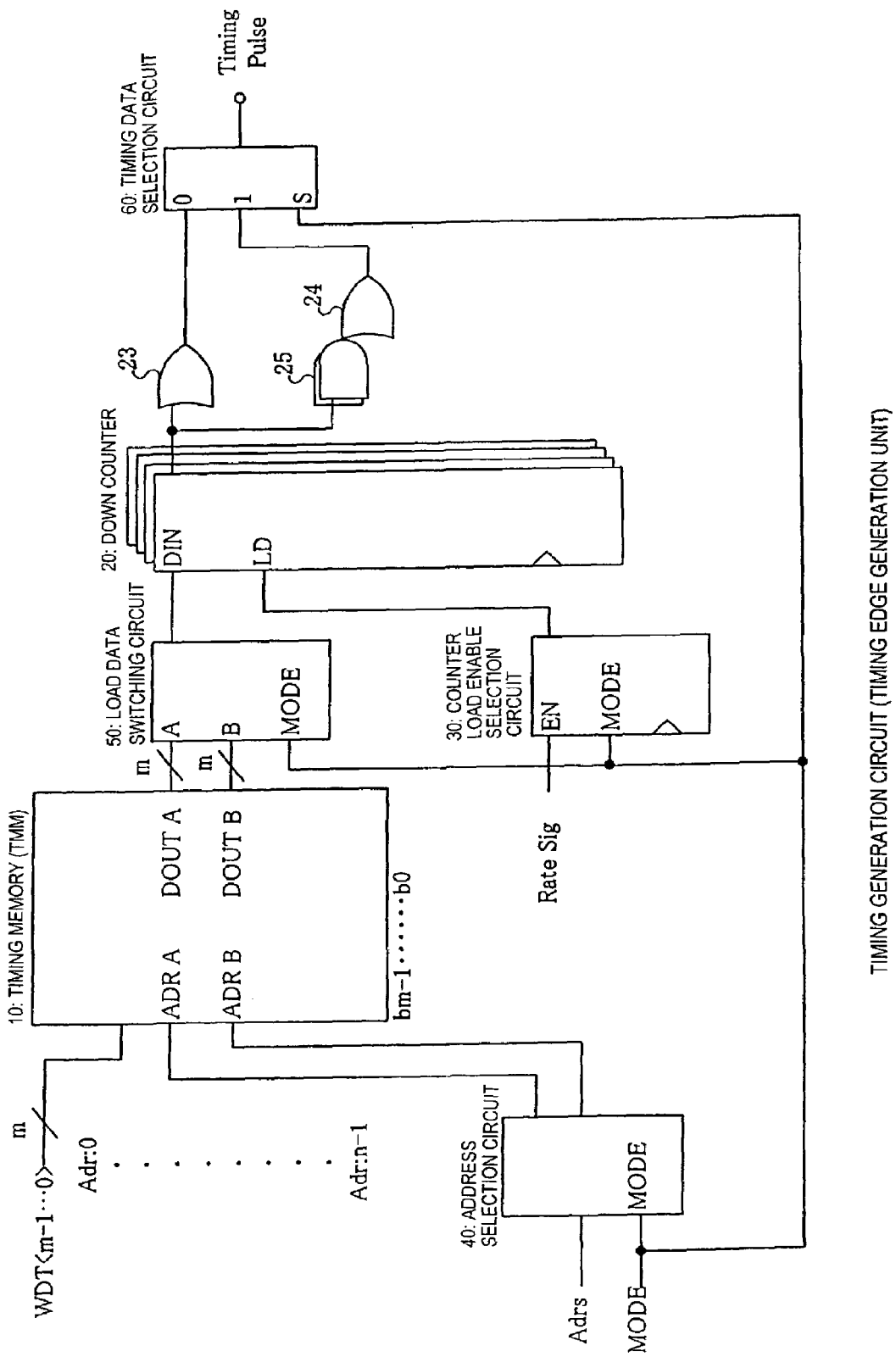
FIG. 1 is a circuit block diagram showing a timing edge generation unit of a timing generation circuit according to a first embodiment of the present invention.
Figure 2:
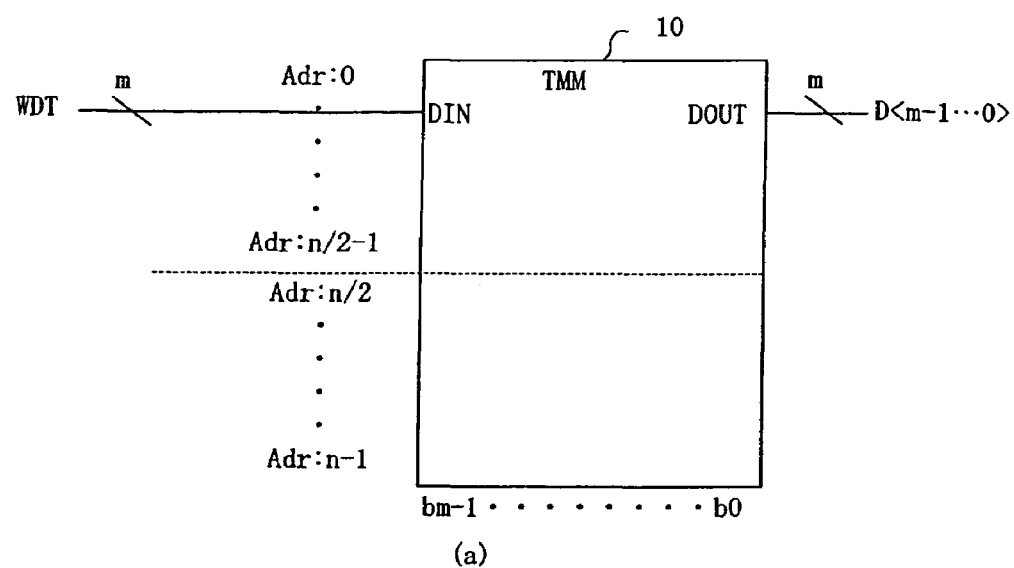
FIGS. 2(a) and 2(b) are explanatory views schematically showing switching of a timing data length in a timing memory of the timing edge generation unit shown in FIG. 1.
Figure 2:
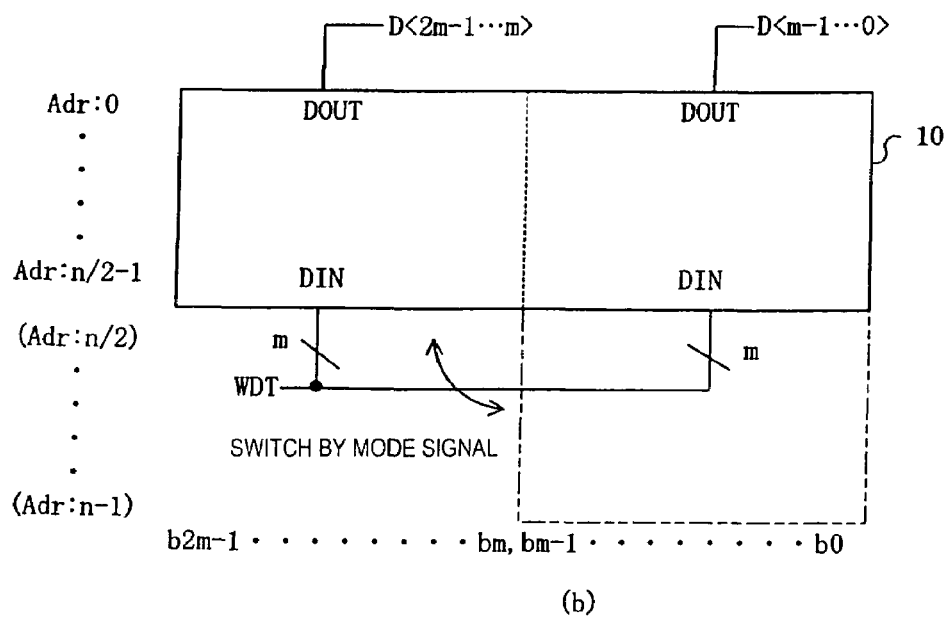

FIG. 1 is a circuit block diagram showing a timing edge generation unit of a timing generation circuit according to the first embodiment of the present invention.

FIGS. 2(a) and 2(b) are explanatory views schematically showing switching of a timing data length in a timing memory of the timing edge generation unit shown in FIG. 1.

Figure 3:
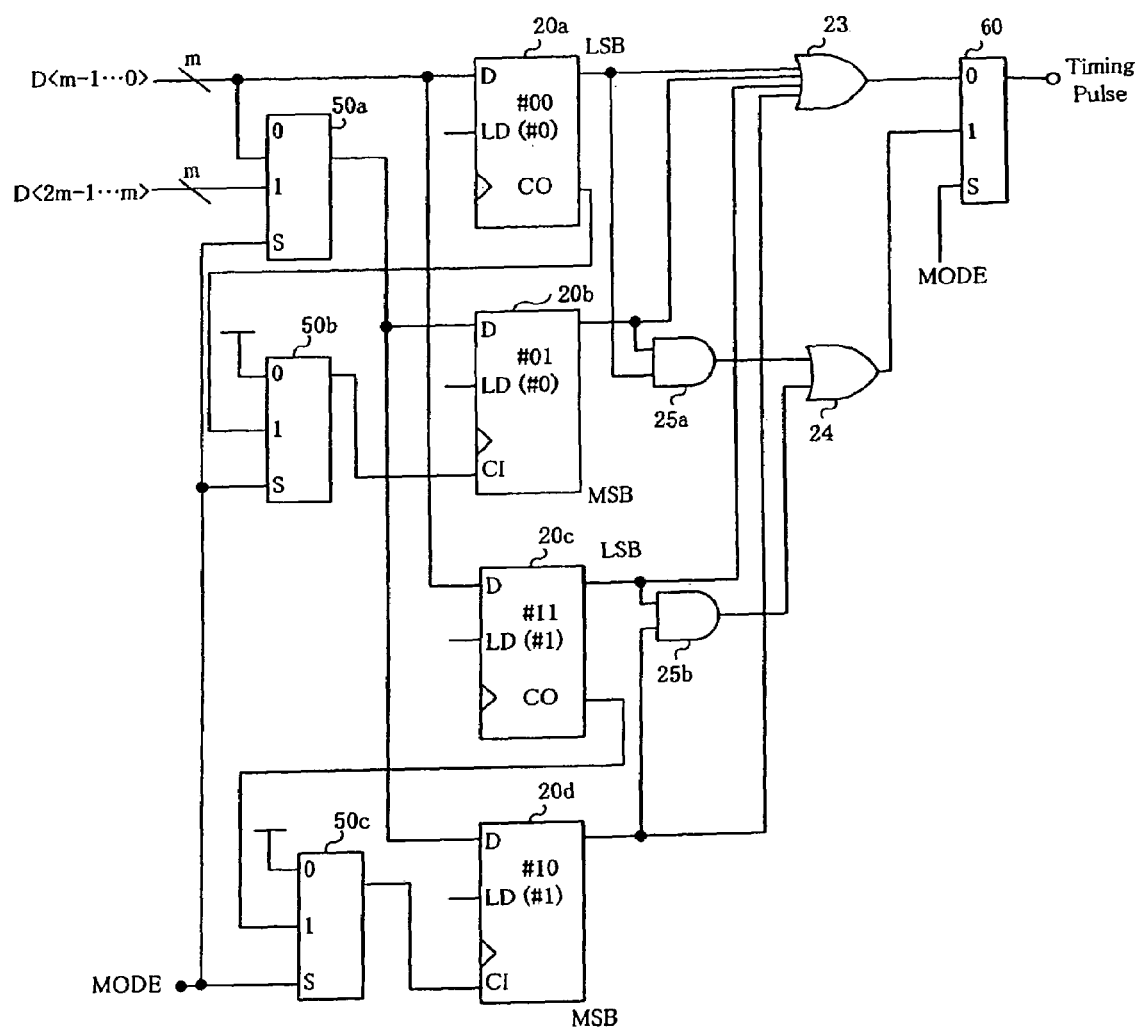
FIG. 3 is a circuit block diagram showing details of a down counter of the timing edge generation unit shown in FIG. 1.

FIG. 3 is a circuit block diagram showing details of a down counter of the timing edge generation unit shown in FIG. 1.

Figure 10:
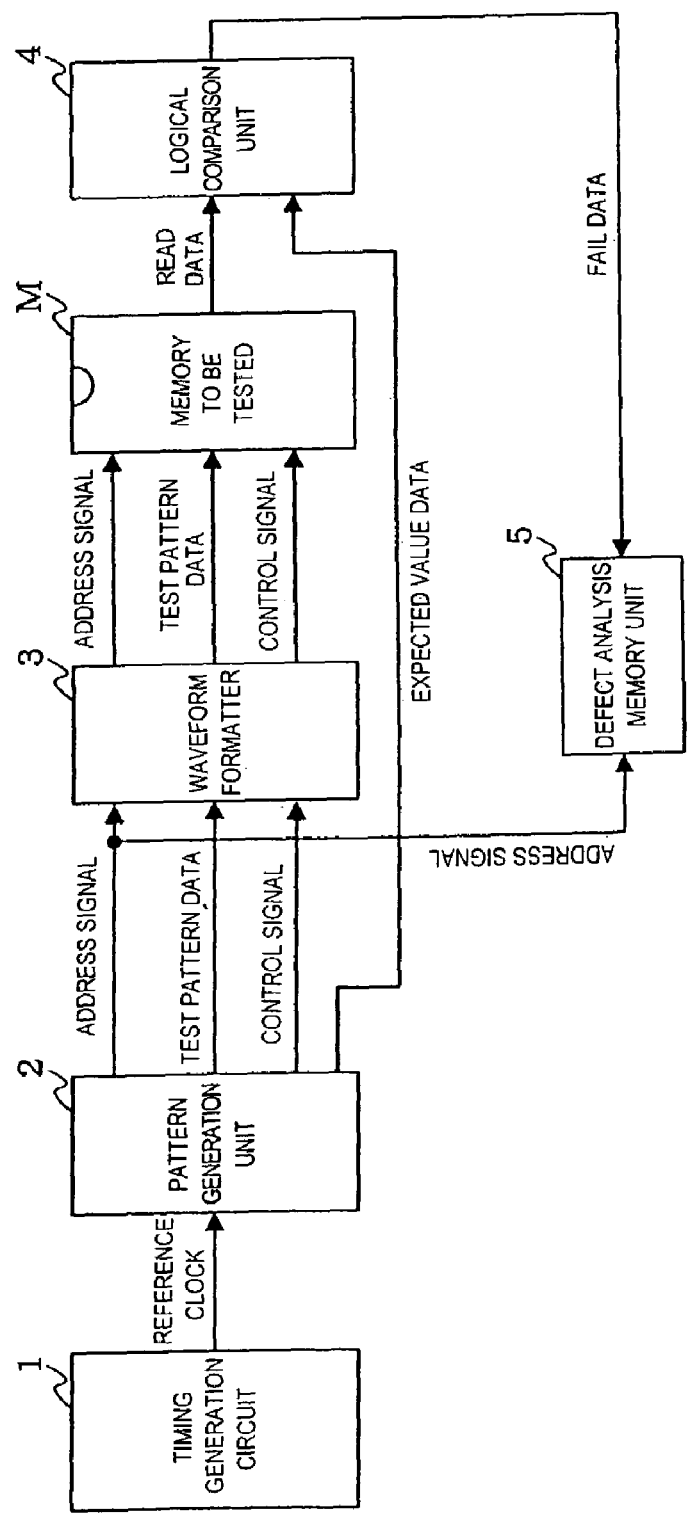
FIG. 10 is a block diagram showing a basic configuration of a general semiconductor memory test device.

The first embodiment of the timing generation circuit (timing edge generation unit) of the present invention shown in these figures is implemented in a semiconductor test device shown in FIG. 10.

The semiconductor test device inputs a test pattern signal to a semiconductor device under test (DUT), compares a response output signal from the DUT with a predetermined expected pattern signal, and judges agreement/disagreement therebetween to thereby test the DUT.

Moreover, this semiconductor test device is provided with a timing generation circuit (TG) (see FIG. 10) which generates a timing of a waveform to be applied to the DUT in order to apply a test signal to the DUT at a predetermined timing. Instead of the conventional TG, a TG (timing generation circuit) according to the present embodiment is implemented in the semiconductor test device of the present invention.

As shown in FIG. 1, the TG of the present embodiment comprises, in the same manner as in the above-described conventional TG: a timing memory (TMM) 10 in which predetermined timing data (e.g., delay data of a reference clock of a test signal, etc.) is stored; a plurality of down counters 20 which load the timing data output from the TMM 10 and which output pulse signals at a timing indicated by the timing data; and a counter load enable selection circuit 30 which inputs a load signal into the down counter 20.

As shown in FIG. 2(a), the TMM 10 is constituted, for example, of a plurality of bit output (m bit) memories corresponding to a total bit number m×n, and m-bit (bm−1 to b0) timing data can be stored in each address (Adr: 0 to Adr: n−1).

Moreover, a memory region of this TMM 10 can be divided by load data switching means described later. As shown in FIG. 2(b), the timing data is linked in a data bit width direction, and data having a large delay amount can be loaded as one timing data in the down counter 20 of the next stage.

The down counter 20 is constituted of a m-bit down counter in which timing data output from the TMM 10 is set. When the timing data is set by a load signal of the counter load enable selection circuit 30, and loaded, a value indicated by the timing data is decreased (counted down) by one in synchronization with a CLK signal.

When the counted-down timing data indicates "0", the down counter 20 outputs a pulse signal ("All zero" signal).

This pulse signal is input as a timing signal into a pattern generation unit or the like (not shown), and the timing signal is generated which is represented by a delay time which is an arbitrary integer multiple of a CLK signal period.

Here, the TG of the present embodiment includes a plurality of down counters 20 in the same manner as in the above-described conventional TG, and further includes four-phase down counters 20a to 20d in an example shown in FIG. 1 (see also FIG. 3). Moreover, the four-phase down counters 20a to 20d are provided with a four-input OR gate 23 on an output side so that the pulse signals are successively taken from the four-phase down counters 20a to 20d.

Since a plurality of down counters 20a to 20n are disposed in this manner, the next timing signal is loaded in another down counter and counted down while the timing signal disposed in one down counter is counted down.

Furthermore, in the present embodiment, as to a plurality of (four-phase) down counters 20a to 20d, two of four down counters 20a to 20d can be cascaded (20a and 20b, 20c and 20d) via a load data switching circuit 50 (described later) by switching of a mode signal.

Specifically, as shown in FIG. 3, CO of the first-phase down counter 20a is input into CI of the second-phase down counter 20b by the switching of the mode signal (mode switching), and both the counters 20a, 20b are cascaded, i.e., connected in series. Similarly, CO of the third-phase down counter 20c is input into CI of the fourth-phase down counter 20d by the switching of the mode signal, and both the counters 20c, 20d are cascaded.

When two timing data are loaded from the TMM 10 in two down counters 20a, 20b, or 20c, 20d cascaded in this manner, it is possible to output the pulse signal of one timing indicated by two timing data.

As shown in FIG. 3, the two cascaded down counters 20a, 20b (or 20c, 20d) are provided with an AND gate 25a (or 25b) on its output side, and the pulse signal of one timing indicated by the two timing data is output. As shown in FIG. 3, the two sets of cascaded down counters 20a, 20b and 20c, 20d are provided with a two-input OR gate 24 on the output side so that the pulse signals are successively taken from the two sets of down counters 20a, 20b and 20c, 20d.

Accordingly, in the down counter 20 of the present embodiment, two timing data are linked in the data bit width direction, and a pulse signal can be output which indicates a larger delay amount.

Moreover, the present embodiment comprises load data switching means for dividing the memory region of the TMM 10, selecting one or a plurality of timing data output from the divided memory regions, and loading the selected one or plurality of timing data in a plurality of down counters 20 to output the pulse signal at one timing indicated by one or plurality of loaded timing data.

The load data switching means divides the memory region of the TMM 10 in an address direction by switching ("H" or "L") of a mode signal, links a plurality of timing data output from the divided memory regions in a data bit width direction (see FIG. 2), and loads these data as one timing data in the down counter 20.

Specifically, as shown in FIGS. 1 and 3, the load data switching means of the present embodiment comprises an address selection circuit 40, load data switching circuit 50, and timing data selection circuit 60.

The address selection circuit 40 designates one or a plurality of addresses of the TMM 10 by switching, and outputs one or a plurality of timing data stored in the corresponding one or plurality of addresses.

In the present embodiment, in the address selection circuit 40, as shown in FIG. 1, one designated address is divided by the switching of the mode signal to designate N (N is a natural number) addresses, and N timing data are output from the timing memory.

More specifically, the address selection circuit 40 designates one or two addresses of the TMM 10 by switching of the mode signal, and outputs one or two timing data from the corresponding address.

In the present embodiment, when a mode signal "H" ("1") is input, a valid address length is set to ½ of the standard address length, and two addresses are simultaneously enabled, which means that one address is divided into two addresses.

For setting the valid address length to ½ and divide one address into two addresses in this manner, a selector which switches MSB of the address to "H" or "L" is provided to easily achieve this purpose.

It is to be noted that in the address selection circuit 40, when the mode signal "L" ("0") is input, two same addresses are designated.

The load data switching circuit 50 loads one timing data as is in one down counter 20, when one timing data is output from the TMM 10 by the mode switching, whereas it loads a plurality of timing data in a plurality of cascaded down counters 20, when a plurality of timing data are output from the TMM 10 by the mode switching, thereby outputting the pulse signal of one timing indicated by the one or plurality of timing data.

Specifically, the load data switching circuit 50 loads N (two) timing data in N (two) cascaded down counters 20a to 20n by switching of the same mode signal as that input into the address selection circuit 40, and outputs the pulse signal of one timing indicated by N (two) timing data.

In the present embodiment, as shown in FIG. 3, the load data switching circuit 50 is constituted of three selectors 50a, 50b, 50c switched by the mode signal.

When two timing data are output from the TMM 10, the mode signal "H" ("1") is input into the selectors 50a to 50c to cascade/connect (20a and 20b, 20b and 20d) two of the four down counters 20a to 20d of the next stage. The selectors 50a to 50c load the two timing data in the respective cascaded down counters 20a and 20b, 20c and 20d to output the pulse signal of one timing.

Figure 11:
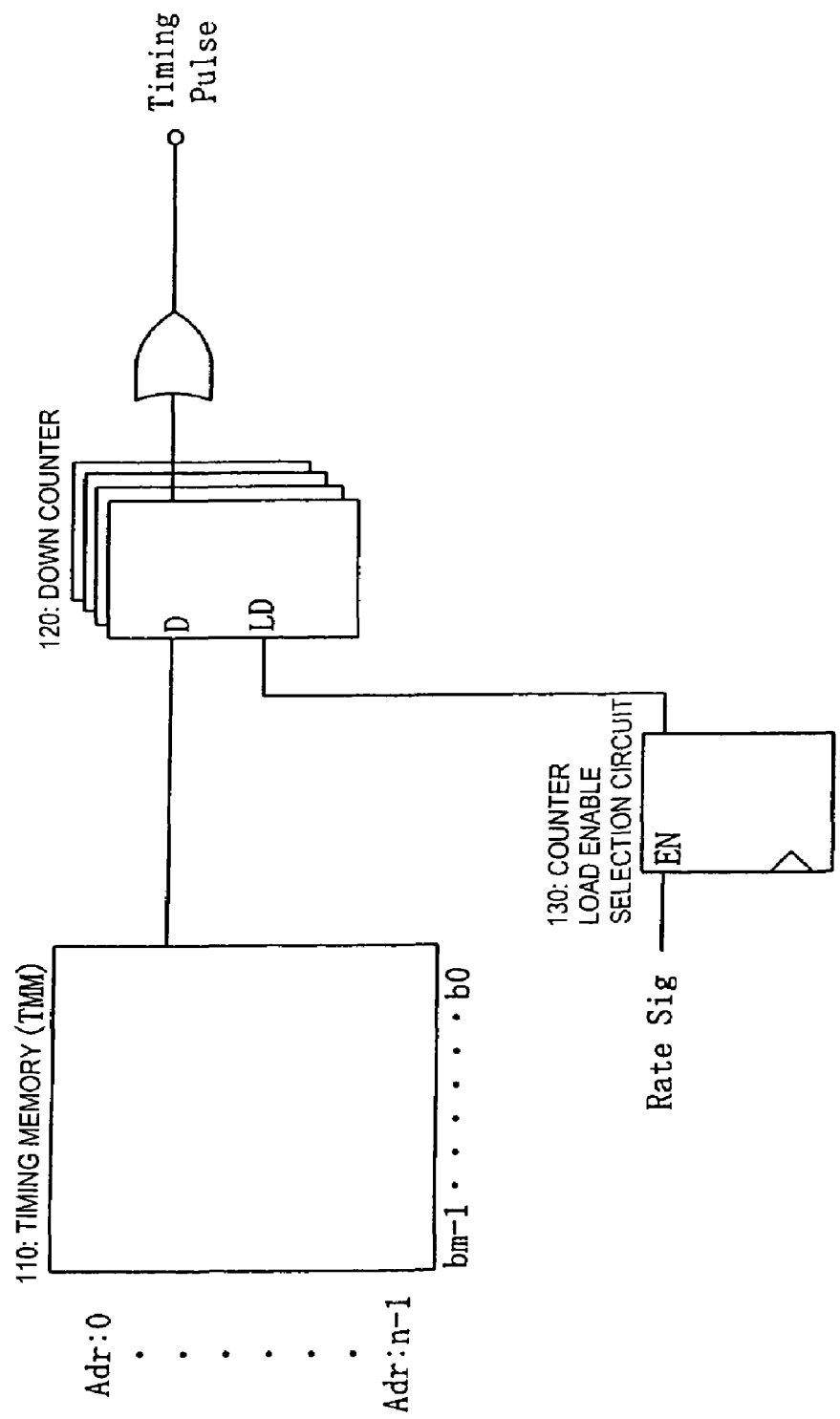
FIG. 11 is a circuit block diagram showing details (timing edge generation unit) of a conventional timing generation circuit.
Figure 12:
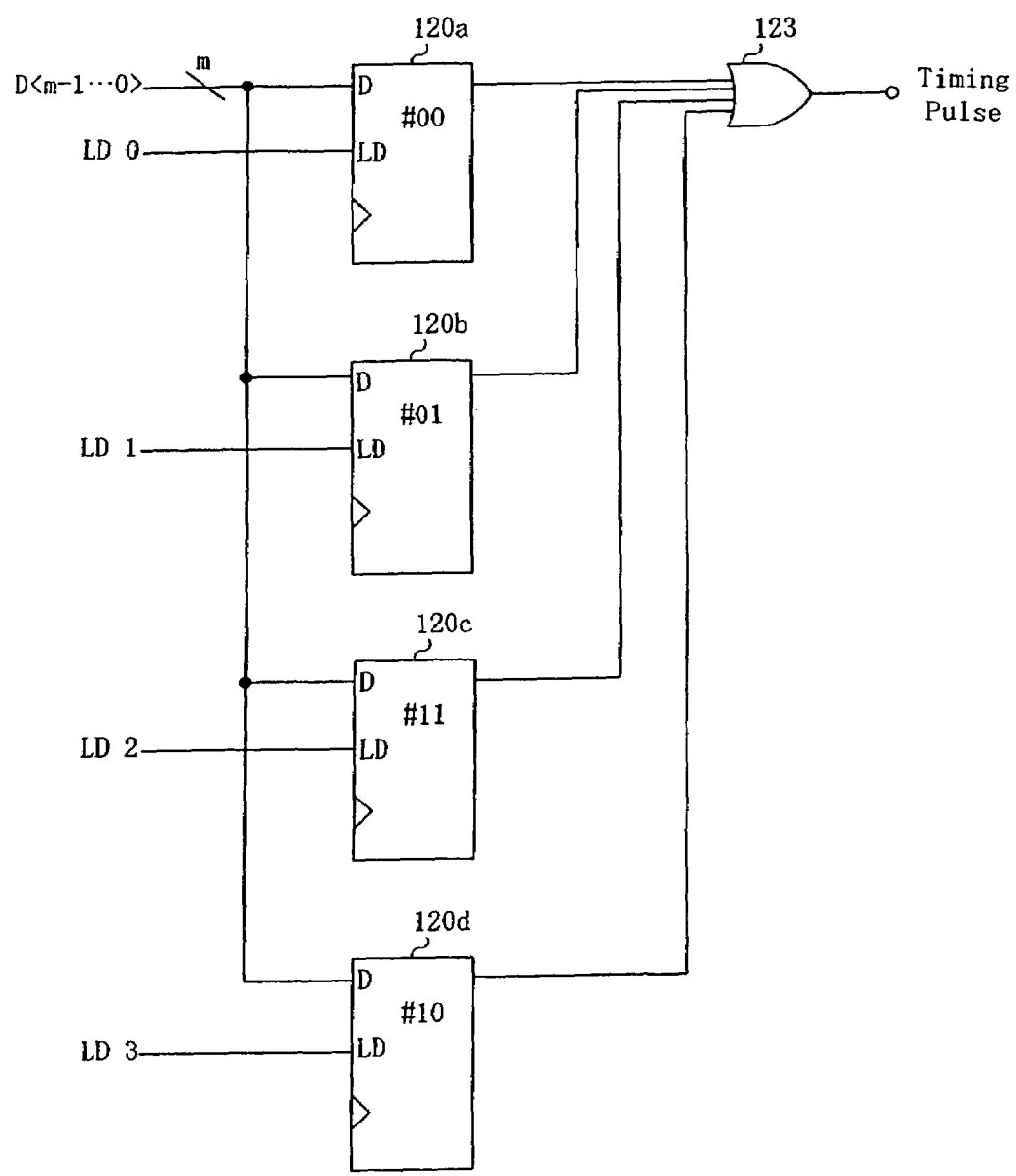
FIG. 12 is a circuit block diagram showing details of a down counter of the timing edge generation unit shown in FIG. 11.

On the other hand, when one timing data is output from the TMM 10, the mode signal "L" ("0") is input, and one timing data is successively set in four down counters 20a to 20d at a predetermined timing via the first selector 50a. In this case, the down counters 20a to 20d operate in the same manner as in the above-described conventional TG (see FIGS. 11, 12).

The timing data selection circuit 60 selects any of the pulse signals based on the load data switching circuit 50, and one or two timing data output from the down counter 20.

Specifically, the timing data selection circuit 60 is constituted of a selector switchable by the same mode signal as that input into the address selection circuit 40 and the load data switching circuit 50, and selects/outputs the pulse signals successively output from the four-phase down counters 20a to 20d, when the mode signal is "L" ("0"). The timing data selection circuit 60 selects/outputs the pulse signals output from the two cascaded down counters 20a, 20b, and 20c, 20d, when the mode signal is "H" ("1").

Next, an operation of the timing generation circuit will be described according to the present embodiment constituted in this manner with reference to the drawing.

In the present embodiment, in a case where the memory region of the TMM 10 is used as is, and the timing data having a usual (standard) bit width of the TMM 10 is stored and output (standard delay mode), the mode signal is switched to "L". In a case where the memory region of the TMM 10 is divided, and two or more data are linked to output timing data having a larger delay amount (long delay mode), the mode signal is switched to "H".

In the mode switching, a user or the like who uses the semiconductor test device can arbitrarily select and switch beforehand the mode in accordance with a semiconductor or the like to be tested.

[Standard Delay Mode]

First, in the standard delay mode in which the memory region of the TMM 10 is used as is, the mode signal is set to "L". It is to be noted that, in this case, the TG of the present embodiment is usable in the same manner as in the above-described conventional TG (see FIGS. 11, 12).

When the mode signal "L" enters, the address selection circuit 40 enables one (same) address of the TMM 10 without setting the valid address to ½. Therefore, desired timing data (m-bit WDT shown in FIG. 1) can be stored and output with respect to one designated address (ADR A or ADR B shown in FIG. 1).

The TMM 10 outputs m-bit data (DOUT A or DOUT B shown in FIG. 1), and the m-bit data is input into the next-stage load data switching circuit 50 and down counters 20*a* to 20*d*.

Specifically, as shown in FIG. 3, timing data (D<m−1 . . . 0> shown in FIG. 3) is set as is in the first-phase down counter 20*a* and the third-phase down counter 20*c*, and the same data (D<m−1 . . . 0> shown in FIG. 3) is set in the second-phase down counter 20*b* and the fourth-phase down counter 20*d* via the selector 50*a* of the load data switching circuit 50.

The timing data set in the respective down counters 20*a* to 20*d* are loaded by the load signal of the counter load enable selection circuit 30, and accordingly decremented by one in synchronization with each occurrence of the CLK signal in the respective down counters 20*a* to 20*d*.

Moreover, when the counted-down timing data indicates "0", the pulse signals ("ALL zero" signals) are output from the respective down counters 20*a* to 20*d*, and are selected by the timing data selection circuit 60 via the OR gate 23. This pulse signal is input as a timing signal into a pattern generation unit or the like (not shown).

In this standard delay mode, as shown in the table of FIG. 4, the memory region (n×m in the memory shown in FIG. 2) of the TMM 10 is used as is, and the timing data is stored and output. Therefore, usable timing data are n sets of data having an m-bit width.

Moreover, four phases of m-bit down counters are used in the down counters 20*a* to 20*d*, and a maximum timing delay is [SysCLK ($2^m$−1), m=1 . . . m].

[Long Delay Mode]

Next, in the long delay mode in which the memory region of the TMM 10 is divided, and data having a larger delay amount is used, the mode signal is set to "H".

When the mode signal "H" enters, the address selection circuit 40 sets the valid address to ½, and enables two addresses of the TMM 10. Accordingly, desired timing data (m-bit WDT shown in FIG. 1) can be stored and output with respect to two designated addresses (ADR A and ADR B shown in FIG. 1).

Accordingly, the TMM 10 outputs timing data (DOUT A and DOUT B shown in FIG. 1) from two addresses, respectively, and two m-bit data are input into the next-stage load data switching circuit 50 and down counters 20*a* to 20*d*.

Specifically, as shown in FIG. 3, among two m-bit timing data, one m-bit data (D<m−1 . . . 0> shown in FIG. 3) is set as is in the first-phase down counter 20*a* and the third-phase down counter 20*c*.

Among two m-bit timing data, the other m-bit data (D<2m−1 . . . 0> shown in FIG. 3) is input into the selector 50*a* of the load data switching circuit 50, and set in the second-phase down counter 20*b* and the fourth-phase down counter 20*d* via the selector 50*a*.

Moreover, as shown in FIG. 3, when the mode signal "H" enters the respective down counters 20*a* to 20*d*, CO of the first-phase down counter 20*a* is input into CI of the second-phase down counter 20*b*. Similarly, CO of the third-phase down counter 20*c* is input into CI of the fourth-phase down counter 20*d*, and the down counters 20*a*, 20*b*, and 20*c*, 20*d* are cascaded.

Accordingly, the two timing data are linked in the bit width direction of the data, and the bit width of the timing data becomes twice (2m bits) the bit width (m bits) of the standard delay mode.

That is, the timing data set in the respective down counters 20*a* to 20*d* are loaded by the load signal of the counter load enable selection circuit 30, and accordingly two timing data are counted down in the two cascaded down counters 20*a*, 20*b* (or 20*c*, 20*d*). Accordingly, long delay data can be counted which is indicated by the bit width which is two times longer than that of the standard delay mode.

Thereafter, when the counted-down timing data indicates "0" in the same manner as in the standard delay mode, the pulse signals ("All zero" signals) are output from the respective down counters 20*a*, 20*b* and 20*c*, 20*d*. This signal is selected by the timing data selection circuit 60 via the AND gates 25*a*, 25*b* and the OR gate 24. This pulse signal is input as a timing signal into a pattern generation unit or the like (not shown).

In this long delay mode, as shown in the table of FIG. 4, data (n/2×m) is stored and output in a combined state of the memory regions of the TMM 10, and usable timing data are n/2 sets of data having an m-bit width.

Moreover, as to the down counters 20*a* to 20*d*, two down counters 20*a*, 20*b* (or 20*c*, 20*d*) are cascaded, therefore two phases of 2m-bit down counters are used, and a maximum timing delay is [SysCLK($2^M$−1), 1≦M≦2 m].

As described above, in the timing generation circuit of the present embodiment, a plurality of addresses of the memory (TMM 10) are accessed with one address for outputting a plurality of bits (m bits) in a total bit number m×n. A switchable flexible configuration can be switched by a minimum control signal (at least one mode signal) which is the mode signal, and the selector circuit without requiring increase/decrease of a memory cell number. As a consequence, a plurality of memory configurations can be realized by one memory configuration (m×n).

Consequently, a device similar to a conventional device can be tested using a TS number of the memory configuration similar to that of a conventional IC tester (semiconductor test device), and TG of a timing edge maximum delay. Moreover, low-cost device measurement is possible which has heretofore been impossible by the conventional TG.

That is, according to the TG of the present embodiment, TGs integrally coexist having a plurality of types of TS numbers, timing maximum delay amounts, and different characteristics, and a plurality of types of TG circuits can be realized in a circuit scale similar to the conventional scale.

Moreover, in the TG of the present embodiment in which different types of TG can be easily mixed using the conventional TG circuit as is in this manner while largely suppressing the increase of the circuit scale, the configuration can be realized easily by any IC tester. Therefore, since a function can be optimized/realized at the low cost for each customer, a very useful TG can be provided especially in the IC tester for a low end.

It is to be noted that in the present embodiment, as compared with the conventional TG (see FIG. 11), the data bit width of a system bus needs to be changed to m bits to 2m bits, but this can be realized in a range in which the data bits are allowed, and this is not an increase of circuit scale. Moreover, in a case where it is difficult to set the data bit width of the system bus to m bits or more by the circuit configuration, the timing data may be written twice into the TMM 10 by a system bus interface, and the TG of the present embodiment can be carried out.

As described above, according to the timing generation circuit of the present embodiment, the memory region of the TMM 10 can be divided in the address direction, and one address can be designated to output a plurality of timing data.

Moreover, when the plurality of timing data are cascaded and loaded in the down counter 20, for example, the pulse signal can be output at the long delay timing indicated by the timing data having a double bit width.

Consequently, the maximum delay amount can be increased without increasing the circuit scale of the TMM 10, and the maximum delay amount optimum for the IC tester can be easily obtained at the low cost.

Second Embodiment

Figure 5:
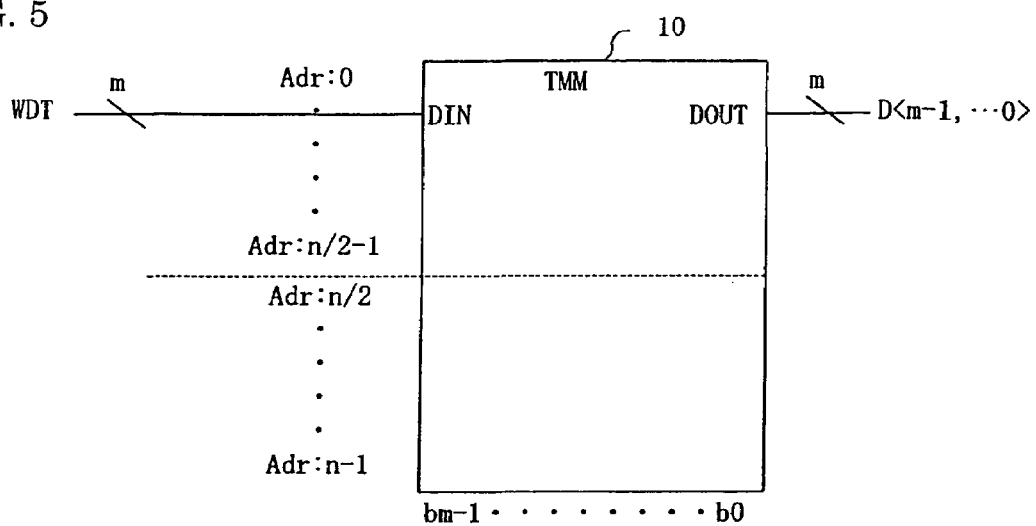
FIGS. 5(a) and 5(b) are explanatory views schematically showing switching of a timing set number in the timing memory of the timing generation circuit according to a second embodiment of the present invention.
Figure 5:
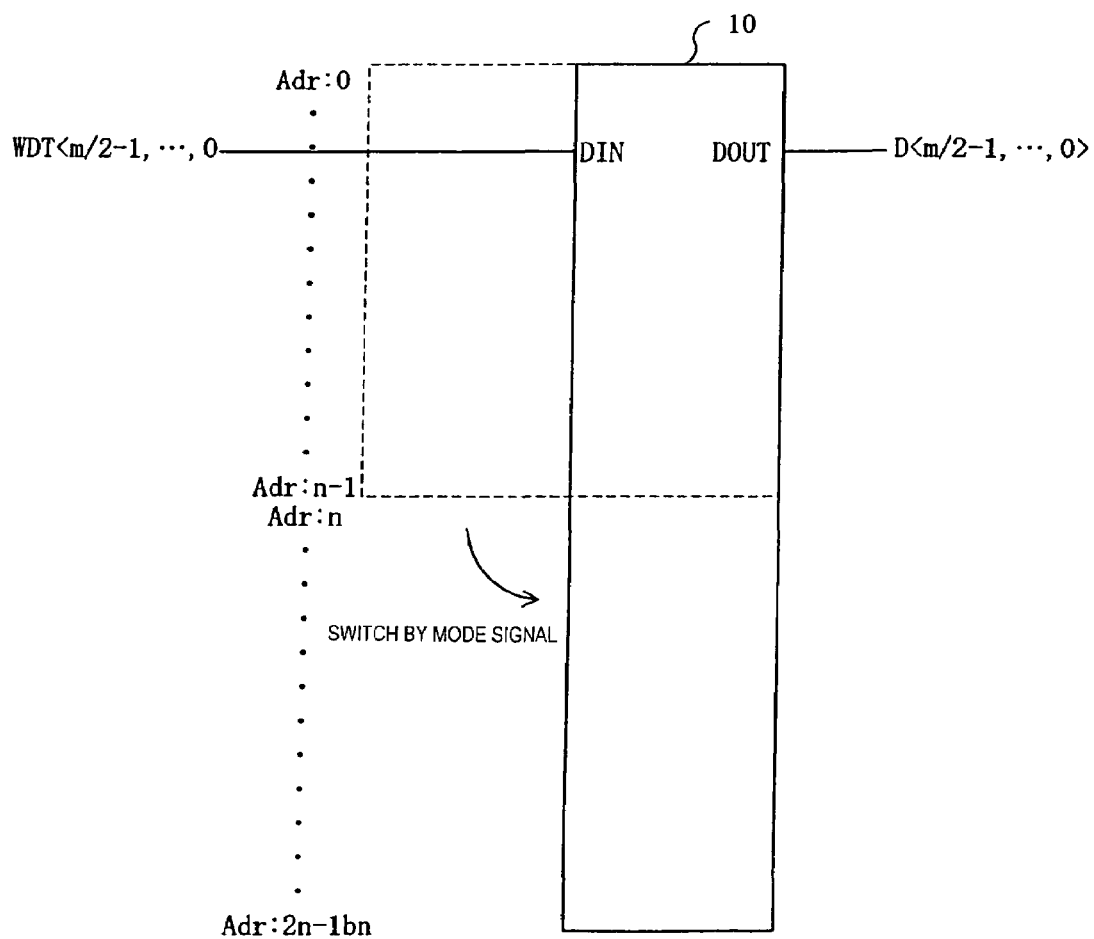

Next, a second embodiment of a timing generation circuit of the present invention will be described with reference to FIGS. 5 to 7.

FIGS. 5(a) and 5(b) are explanatory views schematically showing switching of a timing set number in the timing memory of the timing generation circuit according to the second embodiment of the present invention.

Figure 6:
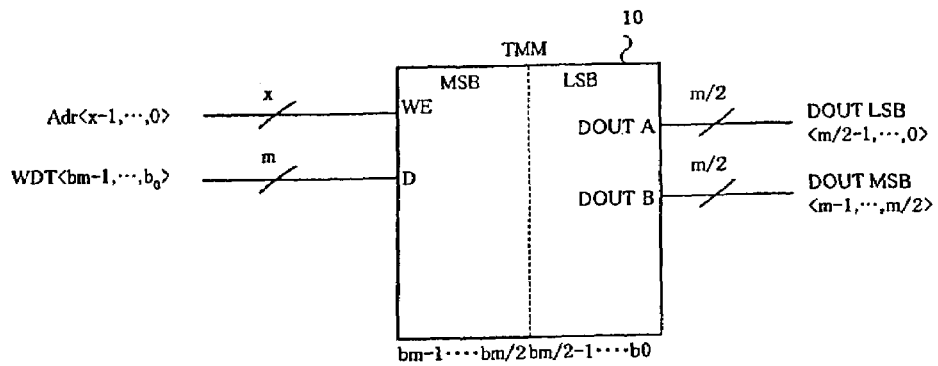
FIG. 6 is a circuit block diagram showing an inner configuration of the timing memory of the timing generation circuit according to the second embodiment of the present invention.
Figure 6:
Figure 6:
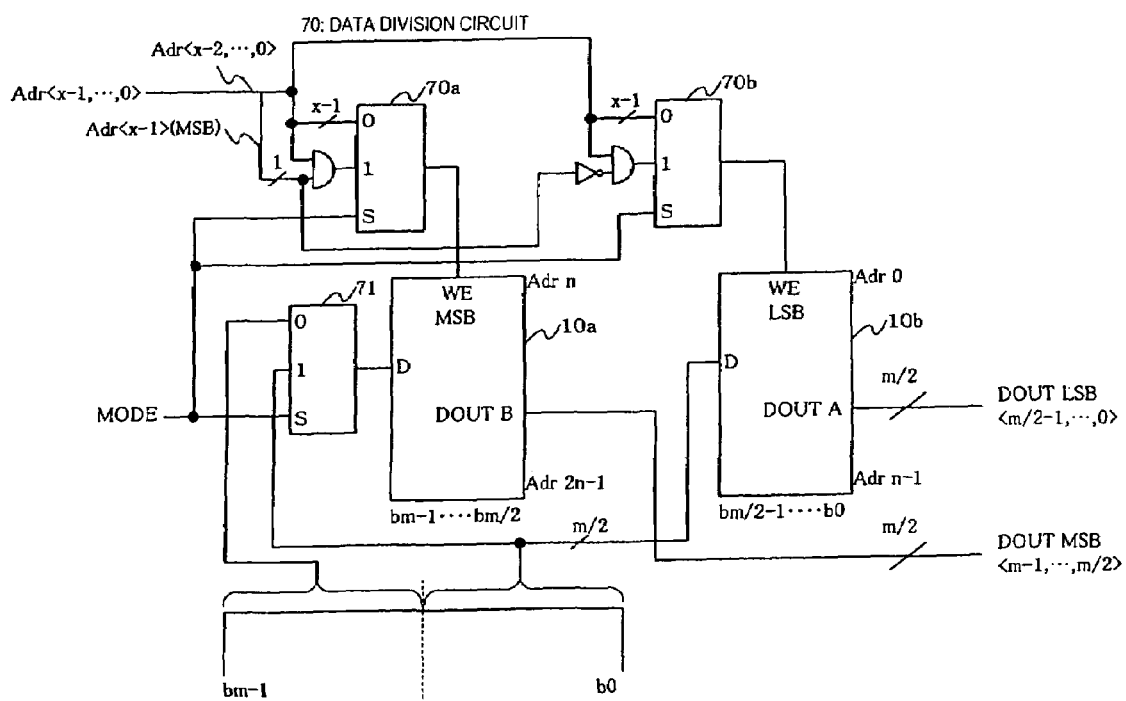

FIG. 6 is a circuit block diagram showing an inner configuration of the timing memory of the timing generation circuit according to the present embodiment.

Figure 7:
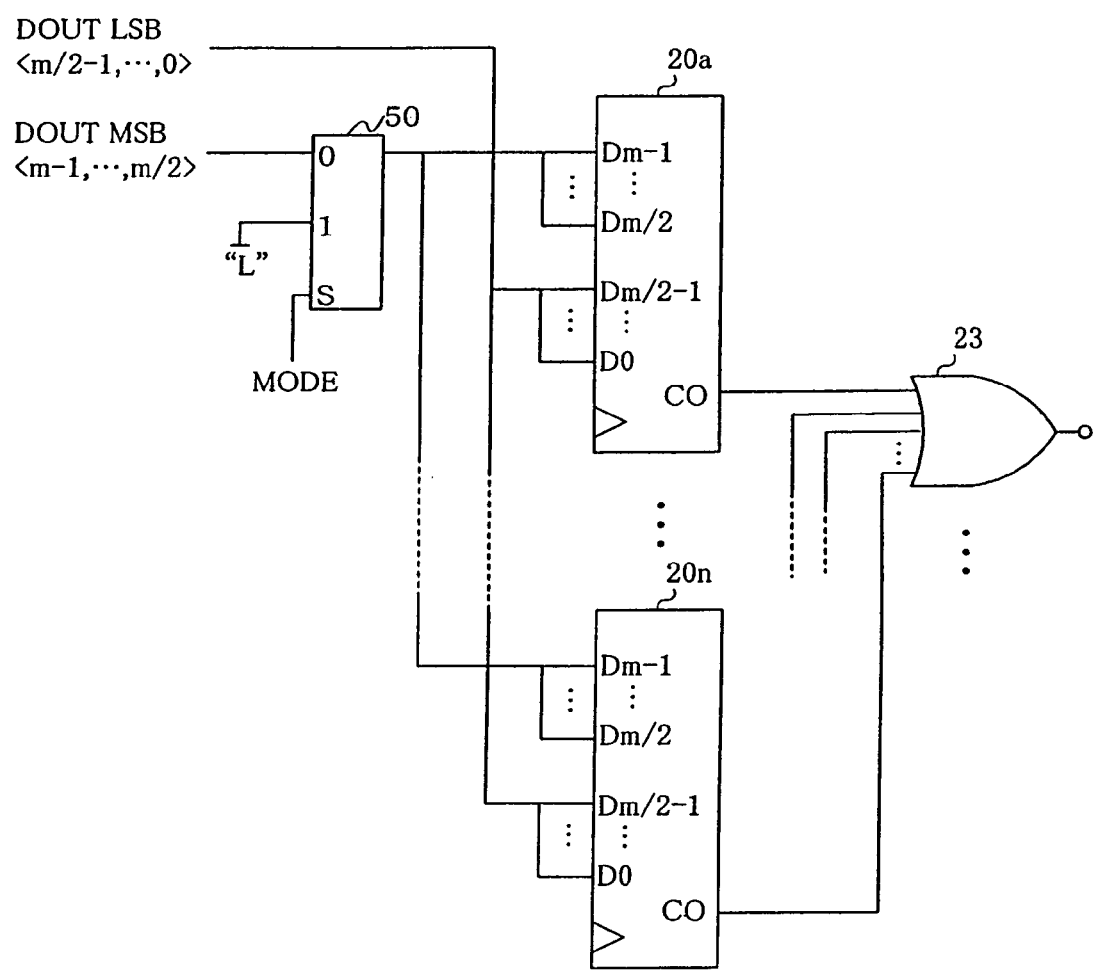
FIG. 7 is a circuit block diagram showing details of a down counter of the timing generation circuit according to the second embodiment of the present invention.

FIG. 7 is a circuit block diagram showing details of a down counter of the timing generation circuit according to the present embodiment.

A TG of the present embodiment shown in these drawings is a modification of the above described first embodiment. In the TG of the first embodiment, the memory region of the TMM 10 is divided in the address direction to link a plurality of timing data in a data bit width direction (see FIG. 2). On the other hand, in the second embodiment, the memory region of the TMM 10 is divided in a data bit width direction, and accordingly a TS (timing set) number of usable timing data can be increased.

That is, the TG of the present embodiment can be constituted basically in the same manner as in the TG and semiconductor test device described in the first embodiment except the division direction (address or data bit width direction) of the memory region of the TMM 10. Therefore, a similar constituting part will be denoted appropriately with the same reference numerals, and detailed description is omitted.

As shown in FIGS. 5(a) and 5(b), in the present embodiment, load data switching means divides the memory region of the TMM 10 in the data bit width direction by switching of a mode signal (mode switching), and selects one timing data from the timing data output from the divided memory regions to load the timing data in the down counter 20. Accordingly, the timing set number (TS number) of usable timing data can be increased without changing the memory configuration of the TMM 10.

Specifically, the load data switching means of the present embodiment includes a data division circuit 70 shown in FIG. 6, a load data switching circuit 50 shown in FIG. 7, and a timing data selection circuit 60 equivalent to that shown in FIGS. 1 and 3.

In the TMM 10 of the present embodiment, as shown in FIG. 6, the memory region is divided into two in the data bit width direction, and comprises a memory 10a on an MSB side and a memory 10b on an LSB side. Moreover, data is written in both the memories 10a, 10b of the TMM 10 divided into two, via the data division circuit 70, and one or two timing data are read out.

The data division circuit 70 divides the timing data stored in one designated address of the TMM 10 into a plurality of timing data, and outputs a plurality of divided timing data by the switching of the mode signal, or outputs one timing data among the plurality of divided timing data.

In the present embodiment, the data division circuit 70 divides one timing data stored in one designated address into N data (N is a natural number) to input the data, and further designates and outputs some or all of the N divided timing data.

Here, when the data is divided in the data bit width direction, and an address is assigned to each divided data, a required address bit number is represented by the following equation:

Address number: $n=2^x$

Required address bit number: $x=\log_2 n$

Since the data is divided into two data in the data bit width direction in the present embodiment, the data can be handled by increasing an address value by one bit. In this manner, an MSB (Adr<x−1> shown in FIG. 6) of the address value in the present embodiment is an address bit for use only in a case where the address of each data is indicated, when the timing data is divided.

According to this data division circuit 70, since an address bit number can be prepared beforehand in accordance with a required maximum address number, an arbitrary division number of two or more divisions can be handled.

Specifically, the data division circuit 70 comprises two selectors: an MSB-side selector 70a and an LSB-side selector 70b.

The MSB-side selector 70a write-enables the MSB-side memory 10a of the corresponding address by the switching of the mode signal, when MSB of one address value of the designated TMM 10 indicates "H" ("1").

The LSB-side selector 70b write-enables the LSB-side memory 10b, when MSB of the address value indicates "L" ("0").

Moreover, the data division circuit 70 comprises a selector 71.

This selector 71 writes in the memory 10a on the MSB side of the TMM 10 half data (m/2bits of bm−1 to bm/2 in FIG. 6) on the MSB side or half data (m/2 bits of bm/2−1 to b0 in FIG. 6) on the LSB side among timing data (m bits of bm−1 to b0 in FIG. 6) having a predetermined bit width to be written in the TMM 10 by the switching of a mode signal.

First, two selectors 70a, 70b enable the valid addresses of both the memories 10a, 10b regardless of a value (Adr<x−

1> shown in FIG. 6) of MSB of a designated address (Adr<x−1 . . . 0> shown in FIG. 6), when the mode signal indicates "L" ("0").

Moreover, the selector 71 writes the half data (m/2 bits of bm−1 to bm/2 in FIG. 6) on the MSB side of one timing data in the memory 10a on the MSB side of the TMM 10, when the mode signal indicates "L" ("0"). At this time, the half data (m/2 bits of bm/2−1 to b0 in FIG. 6) on the LSB side is written in the memory 10b on the LSB side of the TMM 10.

Therefore, the TMM 10 functions as a TMM having a data width of a usual bit width (m bits in FIG. 6) and having a usual address number (depth x−1 in FIG. 6) in a case where the mode signal indicates "L" ("0"). It is to be noted that in this mode "L" ("0"), the MSB (Adr<x−1> in FIG. 6) of the address value is ignored and is not used.

On the other hand, when the mode signal indicates "H" ("1"), two selectors 70a, 70b switch the valid address to be enabled in accordance with the value (Adr<x−1> shown in FIG. 6) of the MSB of the designated address (Adr<x−1 . . . 0> shown in FIG. 6).

First, when the MSB of the designated address indicates "H" ("1"), the MSB-side memory 10a of the corresponding address of the TMM 10 is write-enabled (WE) via the MSB-side selector 70a.

On the other hand, when the MSB of the designated address indicates "L" ("0"), the LSB-side memory 10b of the corresponding address of the TMM 10 is write-enabled (WE) via the LSB-side selector 70b.

Moreover, when the mode signal indicates "H" ("1"), the selector 71 writes the LSB-side half data (m/2 bits of bm/2−1 to b0 in FIG. 6) of one timing data into the MSB and LSB-side memories 10a, 10b of the TMM 10.

Therefore, in the mode signal "H" ("1"), the TMM 10 functions as a TMM having a data width of half of a usual bit width (m/2 bits in FIG. 6) and having twice the usual address number (depth 2x−2 in FIG. 6). It is to be noted that in this mode "H" ("1"), the MSB-side half data (m/2 bits of bm−1 to bm/2 in FIG. 6) is ignored and is not used.

The load data switching circuit 50 loads a plurality of timing data in a plurality of cascaded down counters 20, when a plurality of divided timing data are output from the TMM 10 by switching, and loads one timing data as is in one down counter 20, when one divided timing data is output from the TMM 10 by the mode switching, to output the pulse signal of one timing indicated by the divided plurality of timing data or one timing data.

Specifically, the load data switching circuit 50 loads N (two) divided timing data in the corresponding N (two) down counters 20a to 20n by switching of the same mode signal as that input into the data division circuit 70, and accordingly outputs the pulse signal of the timing indicated by N (two) timing data per address.

In the present embodiment, arbitrary N phases of m-bit down counters 20 (down counters 20a to 20n) are disposed in which the timing data output from the TMM 10 is set in the same manner as in the first embodiment. The load data switching circuit 50 connects the MSB side (DOUT MSB shown in FIG. 7) to a data input of the down counter 20 among the timing data (DOUT MSB and DOUT LSB shown in FIG. 7) divided and output from the TMM 10 in the arbitrary N phases of m-bit down counters 20a to 20n.

Specifically, when MODE does not rise, that is, the mode signal indicates "L" ("0"), the valid bit of the timing data of the TMM 10 has a usual bit width (m bits). Therefore, the load data switching circuit 50 sets the MSB-side timing data (DOUT MSB shown in FIG. 7) in the down counters 20a to 20n. At this time, the LSB-side timing data (DOUT LSB shown in FIG. 7) is set as is in the down counters 20a to 20n. Accordingly, the timing indicated by the m-bit timing data is counted down in the down counters 20a to 20n.

On the other hand, when MODE rises, that is, the mode signal indicates "H" ("1"), the valid bit of the timing data is halved (m/2 bits). Therefore, the load data switching circuit 50 sets a selector input to "L" level. Accordingly, the data set in the down counter 20 is only LSB-side timing data (DOUT LSB shown in FIG. 7), the valid bit number is m/2, and the timing indicated by the m/2-bit timing data is counted down.

The next stage of the down counters 20a to 20n is provided with an OR gate 23 in the same manner as in the first embodiment, and further the next stage comprises a timing data selection circuit 60 (not shown). They function in the same manner as in the first embodiment, and detailed description is omitted.

It is to be noted that in the present embodiment, as shown in FIG. 7, the connection configuration of the m-bit down counter is unchanged regardless of the switching of the mode signal. Needless to say, this counter may be constituted in such a manner as to be connectable in cascade as described in the first embodiment.

In this case, the counters are assembled beforehand in such a manner that the m/2-bit down counters 20a to 20n are constituted as shown in FIG. 3 in such a manner as to obtain a valid data bit number of m/2 at a time when the mode signal is indicated "H" ("1"). Accordingly, in MODE=0, i.e., the mode signal is indicated "L" ("0"), the selectors are assembled (see the selectors 50a to 50c of FIG. 3) in such a manner to establish cascade connection of two of m/2-bit down counters 20a to 20n (in the same manner as in FIG. 3), N-phase m-bit counters are constituted, and 2N-phase m/2-bit down counters can be operated in MODE=1.

By this counter constitution, there is an advantage that timing edge outputs which are 2N times a test rate are possible at a time when MODE=1.

According to the timing generation circuit of the present embodiment constituted as described above, the memory region of the TMM 10 can be divided in the bit width direction of the data, and a plurality of timing data can be output from one timing data.

Moreover, when one timing data is selected from a plurality of timing data, the delay amount of the timing data is reduced, but the TS number can be increased. For example, it is possible to output the timing data having the data set number while an address depth is twice.

Consequently, the timing set number can be increased without changing the circuit configuration of the TMM 10, and the timing generation circuit can be obtained comprising the timing set number optimum for each IC tester easily at the low cost.

The preferable embodiments of the timing generation circuit of the present invention have been described above, but the timing generation circuit according to the present invention is not limited to the above-described embodiment only, and, needless to say, various modifications are possible in the scope of the present invention.

For example, in the above-described first and second embodiments, the example has been described in which the memory region of the TMM is equally divided into two regions, but the memory region does not have to be equally divided, and a division number is not limited to two divisions.

Figure 8:
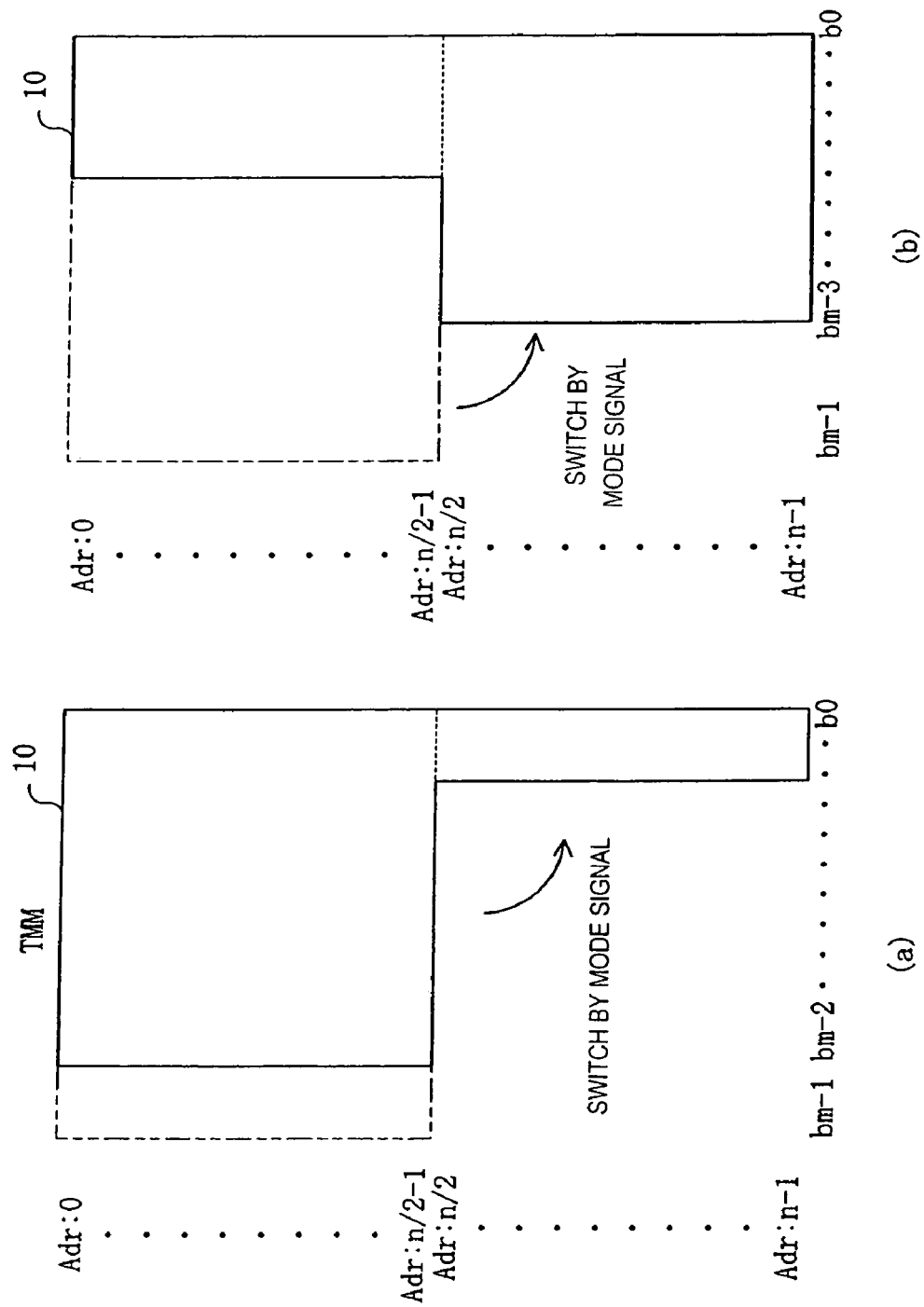
FIGS. 8(a) and 8(b) are explanatory views schematically showing a modification of the timing generation circuit according to the second embodiment of the present invention in a case where the memory region of the timing memory is unequally divided in a data bit width direction.

As shown in FIGS. 8(a) and 8(b), when the memory region of the TMM 10 is divided in the data bit width direction, the bit number may be unequally divided.

In FIG. 8(a), it is possible to store m−1 bit timing data delay in Adr: 0 to Adr: n/2−1, and a delay for only one bit can be stored in Adr: n/2 to Adr: n−1.

Similarly, in FIG. 8(b), it is possible to store 2-bit timing data delay in Adr: 0 to Adr: n/2−1, and a delay for m−2 bits can be stored in Adr: n/2 to Adr: n−1.

Figure 9:
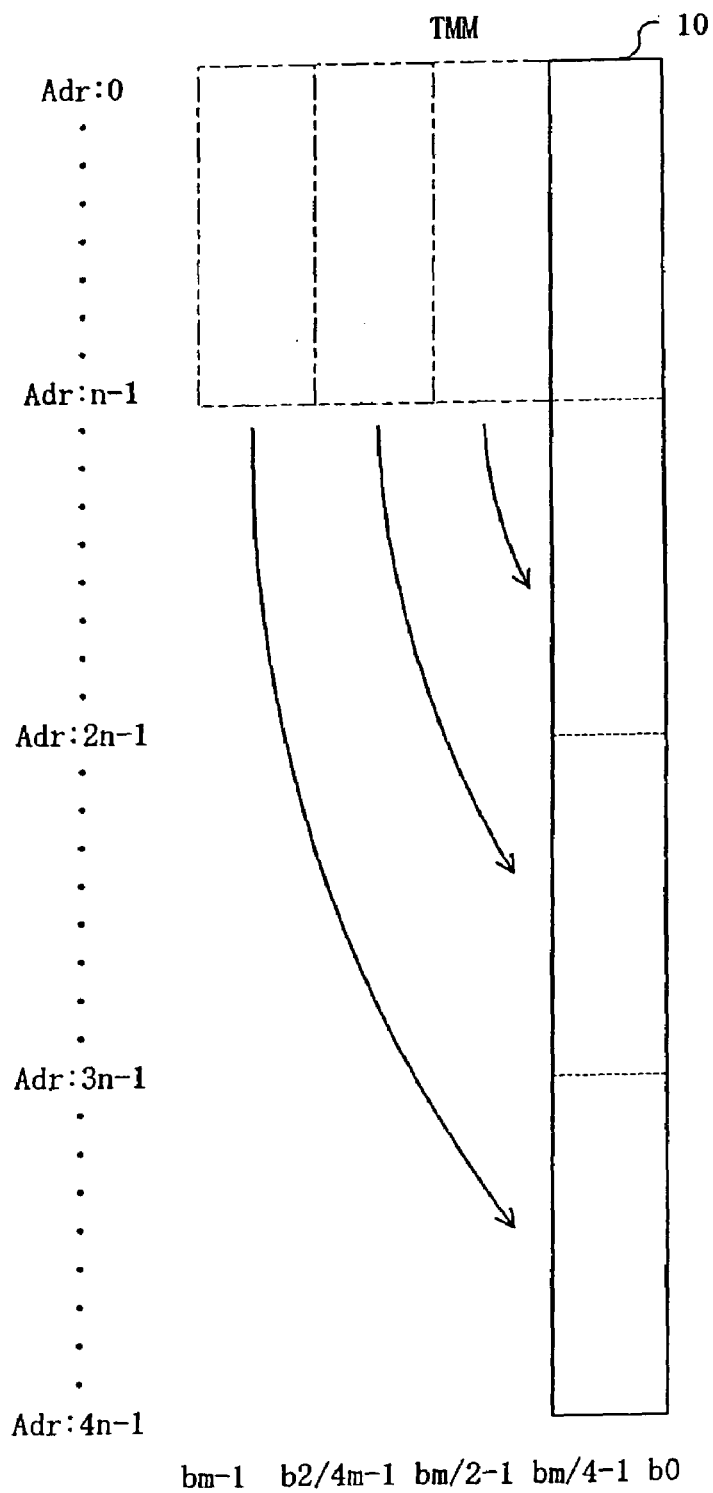
FIG. 9 is an explanatory view schematically showing a modification of the timing generation circuit according to the second embodiment of the present invention in a case where the memory region of the timing memory is equally divided into four regions in the data bit width direction.

Moreover, as shown in FIG. 9, the timing data can be divided into four data in a bit width direction. In this case, the bit number indicating the timing delay is m/4, but the address number (TS number) is 4n. In this case, the address bit number may be increased by 2 bits.

In this manner, in the TMM of the present invention, the maximum value of settable timing delay and TS number may be arbitrarily varied. Therefore, when the switching is possible every bit, and when an area comprising a total bit number of n×m is constant, an assumed memory shape can be freely set and changed.

Needless to say, by combination of the above-described first and second embodiments, the divisions of the memory region can coexist both in the address and data bit width directions. Even in this case, the switching is possible by 2-bit mode signal. For example, the mode signal can be set as follows:

① mode signal 00: usual mode (in the same manner as in a conventional configuration);
② mode signal 01: data delay increase mode (first embodiment); and
③ mode signal 10: TS number increase mode (second embodiment).

As described above, according to a timing generation circuit of the present invention, a maximum delay amount can be increased, or a timing set number can be increased without changing the configuration of a timing memory in which timing data is stored.

Consequently, there can be provided a timing generation circuit and a semiconductor test device in which a plurality of types of TGs can be realized by one type of hardware configuration, and low-cost device measurement is possible.

The invention claimed is:

1. A timing generation circuit comprising:
a timing memory containing predetermined timing data;
a counter for loading timing data output from the timing memory and outputting a pulse signal at a timing indicated by the timing data; and
load data switching means for dividing a memory region of the timing memory, selecting one or a plurality of timing data output from the divided memory regions, and loading the selected one or plurality of timing data in the counter to thereby output the pulse signal of one timing indicated by the one or plurality of timing data;
wherein the load data switching means divides the timing memory into a plurality of memory regions either in a column direction or a row direction to generate the plurality of timing data at the same time.

2. The timing generation circuit according to claim 1, wherein the load data switching means divides the memory region of the timing memory in the column direction which is an address direction of the timing memory in response to switching of a mode signal, links the plurality of timing data output from the divided memory regions in the row direction which is a data bit width direction of the timing memory, and loads these data as one timing data in the counter.

3. The timing generation circuit according to claim 1, wherein the load data switching means comprises:
an address selection circuit which designates one or a plurality of addresses of the timing memory by switching of a mode signal and which outputs one or a plurality of timing data stored in the corresponding one or plurality of addresses; and
a load data switching circuit which loads the one timing data as is in one counter, when one timing data is output from the timing memory by the switching, and which loads the plurality of timing data in a plurality of cascaded counters, when a plurality of timing data are output from the timing memory by the switching, to thereby output the pulse signal of one timing indicated by the one or plurality of timing data.

4. The timing generation circuit according to claim 3, wherein the address selection circuit divides one designated address by the switching to thereby designate N (N is a natural number) addresses, and outputs N timing data from the timing memory, and
the load switching circuit loads the N timing data in N cascaded counters by the switching to thereby output the pulse signal of one timing indicated by the N timing data.

5. The timing generation circuit according to claim 1, wherein the load data switching means divides the memory region of the timing memory in the row direction which is a data bit width direction of the timing memory in response to switching of a mode signal, selects one timing data from the respective timing data output from the divided memory regions, and loads the data in the counter.

6. The timing generation circuit according to claim 1, wherein the load data switching means comprises:
a data division circuit which divides the timing data stored in one address of the designated timing memory into a plurality of timing data and which outputs the plurality of divided timing data in response to switching of a mode signal or which outputs one timing data among the plurality of divided timing data; and
a load data switching circuit which loads the plurality of timing data in a plurality of cascaded counters, when the plurality of divided timing data are output from the timing memory by the switching, and which loads the one timing data as such in one counter, when one divided timing data is output from the timing memory by the switching, to thereby output a pulse signal of one timing indicated by the plurality of or one divided timing data.

7. The timing generation circuit according to claim 6, wherein the data division circuit divides one timing data stored in one designated address into N timing data, inputs the timing data, and further designates and outputs some or all of the N divided timing data, and
the load switching circuit loads the N divided timing data in the corresponding N counters, and thereby outputs a pulse signal of the timing indicated by N timing data per address.

8. A semiconductor test device, which inputs a predetermined test pattern signal into a device under test constituting a test object and which compares a response output signal output from this device under test with a predetermined expected pattern signal to thereby judge whether or not the device under test is satisfactory, the semiconductor test device further comprising:
a timing generation circuit which outputs a reference clock signal of the test pattern signal as a delay clock signal delayed by a predetermined time,
the timing generation circuit comprising:
a timing memory containing predetermined timing data;

a counter for loading timing data output from the timing memory and outputting a pulse signal at a timing indicated by the timing data; and load data switching means for dividing a memory region of the timing memory, selecting one or a plurality of timing data output from the divided memory regions, and loading the selected one or plurality of timing data in the counter to thereby output the pulse signal of one timing indicated by the one or plurality of timing data;

wherein the load data switching means divides the timing memory into a plurality of memory regions either in a column direction or a row direction to generate the plurality of timing data at the same time.

* * * * *